INSTANTANEOUS AUTOMATIC GAIN CONTROL AMPLIFIER

Filed March 29, 1954 2 Sheets-Sheet 1

INVENTOR.
William E. Ayer
BY D. C. Snyder
Paul M. Klein Jr.
Attorneys

Feb. 19, 1957 W. E. AYER 2,782,268
INSTANTANEOUS AUTOMATIC GAIN CONTROL AMPLIFIER
Filed March 29, 1954 2 Sheets-Sheet 2

INVENTOR.
WILLIAM E. AYER
BY W R Maltby
Paul M. Klein Jr.
ATTORNEYS 2,782,268
Patented Feb. 19, 1957

2,782,268

INSTANTANEOUS AUTOMATIC GAIN CONTROL AMPLIFIER

William E. Ayer, San Carlos, Calif., assignor, by mesne assignments, to the United States of America as represented by the Secretary of the Navy Application March 29, 1954, Serial No. 419,636

4 Claims. (Cl. 179—171)

This invention relates to instantaneous automatic gain control amplifiers and more particularly to video amplifiers adapted to receive pulsed signals of the type encountered in many microwave receiving systems.

Prior art automatic gain control systems generally suffered from such defects as not being instantaneous in operation and being unable to handle signals of both polarities simultaneously. An object of the present invention is to provide an automatic gain control system which is instantaneous and in which a gain reduction, for example, lasts only as long as the signal causing the reduction. Another object of the invention is to provide an automatic gain control system which handles simultaneously signals of both polarities. Other objects and many of the attendant advantages of this invention will be readily appreciated as the same becomes better understood by reference to the following detailed description when considered in connection with the accompanying drawings wherein the Fig. 1 is a schematic diagram illustrating a preferred embodiment of the invention shown as applied to one stage of an amplifier and Fig. 2 is a schematic diagram similar to Fig. 1 but showing an alternative arrangement of the bias voltage supply.

While the invention is of general utility in amplifiers it is particularly useful in what are known as video amplifiers of the type used in many microwave systems. In such receiving systems the incoming signal is detected directly and then amplified to provide a usable output signal. When the received signals are of a pulsed nature, a video amplifier must be used following the detector to reproduce the envelope of the input signal. The amplifier of this invention when used in a video system is commonly a multi-stage arrangement but for simplicity only one stage is illustrated. The incremental gain of a stage is determined instantaneously by the signal current through the tube of that stage. Diodes (crystals, vacuum tubes or other types of rectifying devices) are connected in the cathode circuit of the stage of a more or less conventional amplifier to introduce degeneration for signals above a predetermined amplitude. That is, the arrangement is such that when the instantaneous excursion of the grid voltage from quiescent value exceeds a certain amount (either positive or negative), the gain of the stage is reduced by cathode degeneration. This degeneration is accomplished by allowing the signal to alter the bias on one or the other of the two diodes used to such an extent that normal quiescent conduction is stopped. When this occurs, a high value of resistance (effectively bypassed by the low dynamic resistance of the diodes at small signal levels) is introduced between cathode and the common return, accomplishing the desired degeneration. The gain reduction achieved in this manner lasts only as long as the signal, so that recovery time is not adversely affected.

Figure 1:
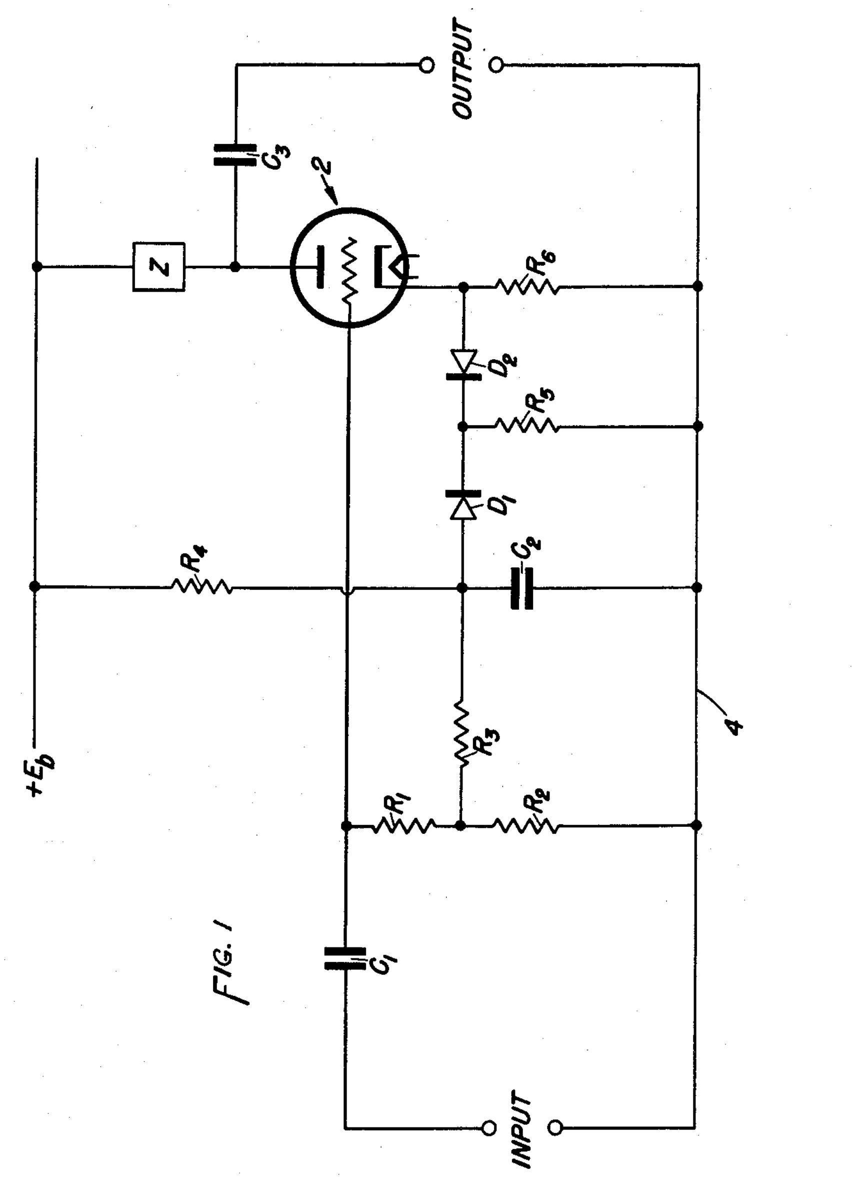
Figure 2:
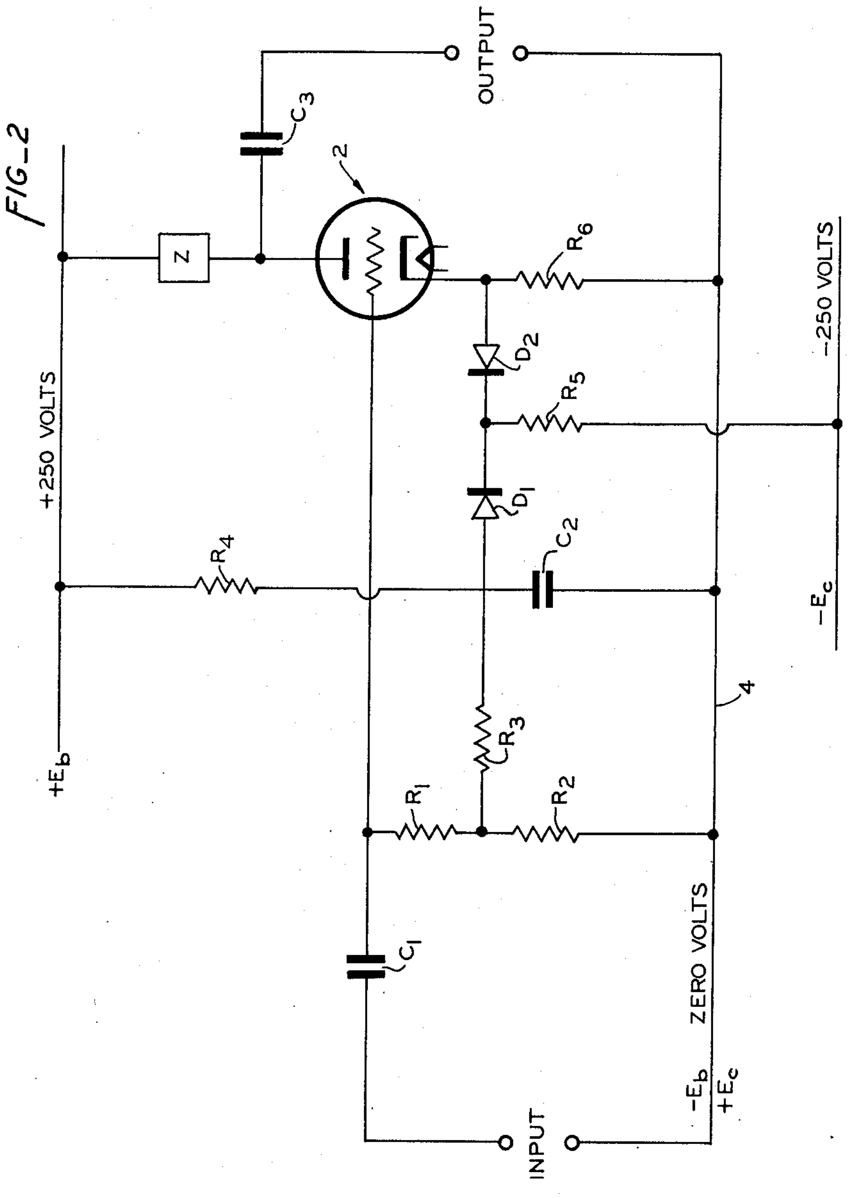

Reference is now made to Fig. 1 of the drawings showing an amplifier stage including more or less conventional elements such as a tube, shown for simplicity only as a triode, indicated generally at 2 having a plate load impedance Z and being supplied with a supply voltage $E_b$. The condensers $C_1$ and $C_3$ are normal coupling condensers. The resistors $R_1$, $R_2$, and $R_3$ are used to obtain proper grid bias for the tube and are not a part of the invention.

A pair of diodes $D_1$ and $D_2$, preferably either crystals (e. g. germanium) or vacuum tubes, are connected so as to form with the condenser $C_2$, at the frequencies to be encountered, a path of relatively low impedance between the cathode of the tube 2 and the common return 4. As shown, the emitters of the two diodes are electrically tied together while their collectors are tied, respectively, to a power supply formed from $E_b$ and $R_4$ and to the cathode of tube 2. The resistors $R_4$, $R_5$, $R_6$ are chosen so that the quiescent diode currents are of the proper magnitudes to give the desired output/input signal characteristic. It should be noted that although for convenience the same power supply used for the plate supply of tube 2 is illustrated as supplying power for the diode $D_1$, the power supply for $D_1$ can be obtained from any other suitable source such as a separate battery or power supply. The negative side of the chosen source must, of course, lead to the common return 4. It is preferable to use a source including a resistor such as $R_4$ so that the source will serve as a more or less constant current supply for the diode $D_1$. The use of such a constant current source including a constant voltage such as $E_b$, a resistor such as $R_4$ and a condenser such as $C_2$ makes the system self-compensating to accommodate a variety of amplifying tubes having different tube characteristics. The condenser $C_2$ is chosen so that the potential at its upper terminal will not change appreciably during the longest uni-polar signal encounter if the lead to the diode $D_1$ were disconnected from the condenser for this interval of time. In effect, this means that the condenser $C_2$ is large so that it performs essentially as a battery for pulse amplification. The resistors $R_4$, $R_5$ are generally but not necessarily large in comparison with $R_6$. The resistance of $R_6$ is high relative to the impedance of $C_2$ There is shown in Fig. 2 a typical arrangement using two cascaded stages of amplification employing the following typical values of components in the two identical stages. Each of the triodes consists of half of a 12AT7 tube. A plate supply of plus 250 volts feeds the tube through a 4.7 K. plate load resistor. The cathode resistor also 4.7 K. is connected between cathode and ground. The diodes used are 1N56 germanium diodes with their common resistor being 180 K. connected to minus 250 volts. The ground in this case is at zero relative to the aforementioned plus and minus voltages. The resistances at $R_1$ and $R_2$ are 1 megohm each and the resistor at $R_3$ is 220 K. The resistor at $R_4$ is 330 K. and the condenser at $C_2$ is 30 microfarads. In this arrangement the resistor at $R_2$ and the condenser at $C_2$ terminate at ground rather than at the minus 250 volts supplying the resistor at $R_5$. The condensers at $C_1$ and $C_3$ are each .01 microfarad.

The principle of operation can be understood by considering the action of the circuit under various signal conditions. First, for small signals normal amplification takes place with the impedance between cathode and common return (the latter being hereafter designated for convenience as ground, although not necessarily grounded) provided essentially by the sum of the dynamic resistances of the two conducting diodes since, on the basis of the previously mentioned criterion for choosing $C_2$, its impedance at the lowest frequency encountered will be negligibly small. Typically the cathode-ground impedance due to the conducting diodes will be of the order of a few hundred ohms. The resistance of $R_6$ is typically of the order of several thousand ohms so that it has little effect upon the cathode-ground impedance when the diodes are conducting and, as previously mentioned, $R_5$ is greater than $R_6$ so that its effect on the impedance to ground is also negligible. In effect, then, the only path of consequence for AC tube current from cathode to ground when the diodes are conducting is through the diodes and thence through condenser $C_2$. Under these conditions the stage exhibits maximum gain.

Secondly, assume that a large negative signal is applied to the grid of the tube 2. The current through the tube will decrease under these conditions, and for sufficiently large signals the conduction of diode $D_2$ will effectively cease. This can be explained by noting that whereas the potential at the top of resistor $R_5$ is maintained more or less constant by virtue of the large size of condenser $C_2$, the potential at the top of $R_6$ will become lower, i. e. less positive, when the volt drop across $R_6$ is reduced by the drop in tube current. Thus the potential difference across the elements of the diode $D_2$ is decreased to the point where it will no longer conduct. For all negative input signals larger than this threshold value, then, the cathode-ground impedance will be provided essentially by $R_6$. Since this resistor is made much larger than the quiescent cathode-ground impedance, then a differential action will be achieved wherein the incremental gain for large negative signals is substantially less than for small signals.

Thirdly, assume a large positive signal is applied at the input. In this case the current through the tube 2 will increase, and for sufficiently large signals, conduction through diode $D_1$ will cease. The cathode-ground impedance will then become the parallel combination of $R_5$ and $R_6$. In practice $R_5$ is generally much larger than $R_6$, as previously noted, so that the degeneration for large positive signals is only slightly less than for large negative signals. Under many circumstances, this difference could be eliminated if desirable, by introducing a suitable impedance to signal frequencies in series with $R_5$.

From the foregoing it is apparent that the invention provides an amplifier having an instantaneous automatic gain control wherein the gain of an amplifier stage is instantaneously varied by and inversely with the signal so that the output can be maintained as closely as desired constant during variations of the signal input.

Obviously many modifications and variations of the present invention are possible in the light of the above teachings. It is therefore to be understood that within the scope of the appended claims the invention may be practiced otherwise than as specifically described.

What is claimed is:

1. An amplifier of the type described comprising a tube having a plate, a control grid and a cathode; means for supplying plate voltage to said tube including a positive conductor and a common return; a cathode resistor connected between said cathode and said common return; a first diode having its collector connected to said cathode; a second diode having its collector connected to the positive side of a voltage source of which the negative side is connected to the common return; the emitters of said diodes being electrically tied together; a second resistor connected between said emitters and said common return to form the common path for currents flowing through both of said diodes; and a condenser connected between the collector of said second diode and the said common return.

2. The amplifier of claim 1 wherein the impedance of said condenser to frequencies encountered by said amplifier is low relative to the impedance of either of said resistors.

3. The amplifier of claim 2 wherein the second resistor forming the common path for currents through said diodes is large compared to the resistance of said cathode resistor.

4. The amplifier of claim 2 wherein the power supply for said second diode includes a source of constant voltage and a series resistor to constitute a substantially constant current supply.

References Cited in the file of this patent

UNITED STATES PATENTS

| | | |
|---|---|---|
| 2,215,777 | Benz | Sept. 24, 1940 |
| 2,222,933 | Blumlein | Nov. 26, 1940 |
| 2,548,901 | Moe | Apr. 17, 1951 |
| 2,581,124 | Moe | Jan. 1, 1952 |
| 2,583,345 | Schade | Jan. 22, 1952 |
| 2,697,201 | Harder | Dec. 14, 1954 |